(12) United States Patent
Xu (10) Patent No.: US 11,699,697 B2
(45) Date of Patent: Jul. 11, 2023

(54) ELECTROSTATIC PROTECTION CIRCUIT (71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 107 days.

(21) Appl. No.: 17/386,480

(22) Filed: Jul. 27, 2021

(65) Prior Publication Data

US 2021/0351176 A1 Nov. 11, 2021

Related U.S. Application Data

(63) Continuation of application No. PCT/CN2021/079589, filed on Mar. 8, 2021.

(30) Foreign Application Priority Data

Apr. 20, 2020 (CN) .......................... 202010313422.X (51) Int. Cl.
*H01L 27/02* (2006.01)
*H02H 9/04* (2006.01)

(52) U.S. Cl.
CPC ...... *H01L 27/0266* (2013.01); *H01L 27/0262* (2013.01); *H02H 9/046* (2013.01)

(58) Field of Classification Search
CPC ............. H01L 27/0266; H01L 27/0262; H01L 27/0255; H01L 27/0296; H02H 9/046
USPC .......................................................... 361/56
See application file for complete search history.

(56) References Cited

U.S. PATENT DOCUMENTS 5,289,334 A * 2/1994 Ker ..................... H01L 27/0251
  361/111
5,359,211 A * 10/1994 Croft ................... H01L 27/0259
  257/362
5,430,595 A * 7/1995 Wagner ............... H01L 27/0262
  361/111

(Continued)

FOREIGN PATENT DOCUMENTS

CN 101030575 A 9/2007
CN 101385214 A 3/2009

(Continued)

OTHER PUBLICATIONS

International Search Report in the international application No. PCT/CN2021/079589, dated Jun. 9, 2021, 6 pgs.

(Continued)

*Primary Examiner* — Dharti H Patel
(74) *Attorney, Agent, or Firm* — Cooper Legal Group, LLC (57) ABSTRACT

An electrostatic protection circuit connected with an internal circuit is provided. The electrostatic protection circuit includes: a first circuit, a first diode connected in parallel with the first circuit, a second circuit, and a second diode connected in parallel with the second circuit. The first circuit is connected between a power supply pad and an internal circuit input terminal. The second circuit is connected between the internal circuit input terminal and a ground pad. The first circuit and the second circuit are diode-triggered silicon controlled rectifier circuits. The technical solution of the disclosure can improve electrostatic protection capability of a charged device model of a chip.

16 Claims, 3 Drawing Sheets

(56) References Cited

U.S. PATENT DOCUMENTS

| | | | |
|---|---|---|---|
| 5,473,169 A * | 12/1995 | Ker | H01L 27/0259 257/362 |
| 5,541,801 A * | 7/1996 | Lee | H01L 27/0262 361/111 |
| 5,574,618 A * | 11/1996 | Croft | H02H 9/045 361/220 |
| 5,670,799 A * | 9/1997 | Croft | H01L 27/0259 257/362 |
| 5,754,380 A * | 5/1998 | Ker | H01L 27/0251 361/111 |
| 5,754,381 A * | 5/1998 | Ker | H01L 27/0251 361/56 |
| 5,903,420 A * | 5/1999 | Ham | H01L 27/0259 361/111 |
| 5,905,288 A | 5/1999 | Ker | |
| 6,338,986 B1 | 1/2002 | Kawazoe | |
| 6,385,116 B2 * | 5/2002 | Wang | H01L 27/0255 365/226 |
| 6,617,649 B2 | 9/2003 | Chang | |
| 7,023,677 B2 | 4/2006 | Ker | |
| 7,233,467 B2 | 6/2007 | Mergens | |
| 7,238,969 B2 * | 7/2007 | Wu | H01L 27/0262 257/173 |
| 7,548,401 B2 | 6/2009 | Mergens | |
| 7,755,870 B2 | 7/2010 | Arai | |
| 8,611,058 B2 * | 12/2013 | Fan | H01L 27/0259 361/118 |
| 8,759,871 B2 * | 6/2014 | Song | H01L 27/0262 257/355 |
| 8,956,924 B2 | 2/2015 | Domanski | |
| 9,209,620 B2 | 12/2015 | Fan et al. | |
| 10,134,722 B2 * | 11/2018 | Yam | H01L 27/0635 |
| 10,141,300 B1 * | 11/2018 | Mallikarjunaswamy | H01L 29/861 |
| 10,446,537 B2 * | 10/2019 | Boselli | H10B 63/20 |
| 2002/0037621 A1 | 3/2002 | Kawazoe | |
| 2002/0039825 A1 | 4/2002 | Kawazoe | |
| 2002/0064007 A1 | 5/2002 | Chang | |
| 2005/0184344 A1 | 8/2005 | Ker | |
| 2005/0231866 A1 | 10/2005 | Mergens | |
| 2005/0259372 A1 * | 11/2005 | Lin | H01L 27/0255 257/E27.063 |
| 2006/0132996 A1 * | 6/2006 | Poulton | H01L 27/0255 361/56 |
| 2006/0278928 A1 * | 12/2006 | Wu | H01L 27/0262 257/355 |
| 2007/0201175 A1 | 8/2007 | Arai | |
| 2009/0122452 A1 * | 5/2009 | Okushima | H01L 27/0262 361/56 |
| 2009/0309129 A1 | 12/2009 | Domanski | |
| 2010/0264457 A1 * | 10/2010 | Sorgeloos | H01L 27/0259 257/E27.013 |
| 2010/0321843 A1 | 12/2010 | Domanski | |
| 2012/0099228 A1 * | 4/2012 | Lin | H01L 23/66 361/56 |
| 2012/0218671 A1 | 8/2012 | Domanski | |
| 2013/0050887 A1 * | 2/2013 | Fan | H01L 27/0262 361/57 |
| 2013/0277712 A1 | 10/2013 | Domanski et al. | |
| 2013/0342940 A1 * | 12/2013 | Taghizadeh Kaschani | H02H 9/046 361/56 |
| 2014/0104733 A1 | 4/2014 | Fan et al. | |
| 2015/0144996 A1 | 5/2015 | Domanski et al. | |
| 2015/0228770 A1 * | 8/2015 | Lin | H01L 29/0692 257/173 |
| 2017/0069616 A1 * | 3/2017 | Cai | H01L 27/0262 |
| 2017/0302066 A1 * | 10/2017 | Gao | H03K 5/08 |
| 2019/0229112 A1 | 7/2019 | Kutsukake | |
| 2020/0219867 A1 * | 7/2020 | Grad | H01L 27/0255 |
| 2021/0249849 A1 * | 8/2021 | Bogi | H02H 9/046 |
| 2021/0351176 A1 * | 11/2021 | Xu | H01L 27/0262 |
| 2021/0359511 A1 * | 11/2021 | Xu | H01L 27/0255 |

FOREIGN PATENT DOCUMENTS

| | | | | |
|---|---|---|---|---|
| CN | 103094273 A | | 5/2013 | |
| CN | 103733336 A | | 4/2014 | |
| CN | 106920792 A | * | 7/2017 | |
| CN | 107482004 A | | 12/2017 | |
| CN | 108879632 A | * | 11/2018 | H01L 27/0262 |
| CN | 110071102 A | | 7/2019 | |
| CN | 112447676 A | | 3/2021 | |
| GB | 2128829 A | * | 5/1984 | H01L 27/0248 |

OTHER PUBLICATIONS

Supplementary European Search Report in the European application No. 21792800.1, dated Jul. 15, 2022, 7 pgs.

First Office Action of the European application No. 21792800.1, dated Mar. 6, 2023, 6 pages.

Du, et al. "Low-leakage diode-triggered silicon controlled rectifier for electrostatic discharge protection in 0.18-μm CMOS process", Journal of Zhejiang University Science A, Zheijiang University Press, CN, vol. 10, No. 7, Jul. 1, 2009 (Jul. 1, 2009), pp. 1060-1066, XP036039111, ISSN: 1673-565X, DOI: 10.1631/JZUS.A0820545, 7 pages.

* cited by examiner

ELECTROSTATIC PROTECTION CIRCUIT

CROSS-REFERENCE TO RELATED APPLICATIONS

This is a continuation application of International Patent Application No. PCT/CN2021/079589, filed on Mar. 8, 2021, which claims priority to Chinese patent application No. 202010313422.X, filed on Apr. 20, 2020, and entitled "Electrostatic Protection Circuit". The contents of International Patent Application No. PCT/CN2021/079589 and Chinese patent application No. 202010313422.X are incorporated herein by reference in their entireties.

TECHNICAL FIELD

The present disclosure relates to the field of semiconductor technology, and more particular, to an electrostatic protection circuit.

BACKGROUND

At present, a semiconductor manufacturing process is becoming more and more advanced, a channel length is getting shorter and shorter, and a junction depth is getting shallower and shallower. With the application of silicide and light doping, an oxide layer is getting thinner and thinner, a window adopting an electrostatic discharge (ESD) design is getting smaller and smaller, and the challenge of an ESD protection design is getting larger and larger.

In a conventional Charged Device Model (CDM) electrostatic protection circuit, a breakdown voltage of an oxide layer of a Metal Oxide Semiconductor (MOS) device in an input buffer is greater than a breakdown voltage of a junction of a MOS device for performing electrostatic protection. However, with the development of advanced manufacturing processes, the breakdown voltage of the oxide layer has become less than the breakdown voltage of the junction, and an original ESD design window does not exist.

How to improve CDM electrostatic protection of advanced manufacturing processes integrated circuit products is a technical problem to be solved urgently at present.

It is to be noted that the information disclosed in the background section is merely intended to enhance understanding of the context of the present disclosure, and thus may include information that does not constitute the related art known to those of ordinary skill in the art.

SUMMARY

The embodiments of the present disclosure aim to provide an electrostatic protection circuit, so as to improve the electrostatic protection capability of a CDM of a chip to at least some extent.

Other characteristics and advantages of the present disclosure will be apparent from the following detailed description, or will be learned in part by the practice of the present disclosure.

According to a first aspect of the embodiments of the present disclosure, an electrostatic protection circuit connected with an internal circuit is provided, which include a first circuit, a first diode connected in parallel with the first circuit, a second circuit, and a second diode connected in parallel with the second circuit. The first circuit is connected between a power supply pad and an internal circuit input terminal. The second circuit is connected between the internal circuit input terminal and a ground pad. The first circuit and the second circuit are diode-triggered silicon controlled rectifier (DTSCR) circuits.

In some embodiments, the first circuit includes a first positive-negative-positive (PNP) transistor and a first negative-positive-negative (NPN) transistor. An emitter of the first PNP transistor is connected with the power supply pad. A base of the first PNP transistor is connected with a collector of the first NPN transistor and then connected with the internal circuit input terminal through at least one third diode connected in series. A collector of the first PNP transistor is connected with a base of the first NPN transistor and then connected with the internal circuit input terminal through a first resistor. An emitter of the first NPN transistor is connected with the internal circuit input terminal. A negative electrode of the first diode is connected with the power supply pad. The second circuit includes a second PNP transistor and a second NPN transistor. An emitter of the second PNP transistor is connected with the internal circuit input terminal. A base of the second PNP transistor is connected with a collector of the second NPN transistor and then connected with the ground pad through at least one fourth diode connected in series. A collector of the second PNP transistor is connected with a base of the second NPN transistor and then connected with the ground pad through a second resistor. A positive electrode of the second diode is connected with the ground pad.

In some embodiments, the electrostatic protection circuit further includes a fifth diode and a sixth diode. The fifth diode is connected between the power supply pad and an input pad, and the sixth diode is connected between the input pad and the ground pad. A positive electrode of the fifth diode is connected with the input pad. A positive electrode of the sixth diode is connected with the ground pad.

In some embodiments, the electrostatic protection circuit further includes an input resistor connected between the input pad and the internal circuit input terminal.

In some embodiments, the ground pad and the power supply pad are both located on a bare chip. A first well, a second well and a third well are disposed in a substrate of the bare chip. The substrate is a positive-type (P-type) substrate. The first well, the second well and the third well are all negative (N) wells. The first well includes a first P-type heavily doped region and a first N-type heavily doped region, and the power supply pad is electrically connected with the first P-type heavily doped region. The second well includes a second P-type heavily doped region and a second N-type heavily doped region and the second P-type heavily doped region is electrically connected with the first N-type heavily doped region. The third well includes a third P-type heavily doped region and a third N-type heavily doped region, the third P-type heavily doped region is electrically connected with the second N-type heavily doped region and the internal circuit input terminal is electrically connected with the third N-type heavily doped region.

In some embodiments, the first P-type heavily doped region, the first well and the substrate form the first PNP transistor. The first well, the substrate and the third well form the first NPN transistor.

In some embodiments, the first resistor is formed between the first well and the third well.

In some embodiments, the first diode is formed between the third well and the first well.

In some embodiments, a fourth well, a fifth well and a sixth well are disposed in the substrate. The fourth well, the fifth well and the sixth well are all N wells. The fourth well includes a fourth P-type heavily doped region and a fourth N-type heavily doped region, and the internal circuit input terminal is electrically connected with the fourth P-type heavily doped region. The fifth well includes a fifth P-type heavily doped region and a fifth N-type heavily doped region, and the fifth P-type heavily doped region is electrically connected with the fourth N-type heavily doped region. The sixth well includes a sixth P-type heavily doped region and a sixth N-type heavily doped region, the sixth P-type heavily doped region is electrically connected with the fifth N-type heavily doped region, and the ground pad is electrically connected with the sixth N-type heavily doped region.

In some embodiments, the fourth P-type heavily doped region, the fourth well and the substrate form the second PNP transistor. The fourth well, the substrate and the sixth well form the second NPN transistor.

In some embodiments, the second resistor is formed between the fourth well and the sixth well.

In some embodiments, the second diode is formed between the sixth well and the fourth well.

It is to be understood that the above general description and the detailed description below are merely exemplary and explanatory, and the present disclosure is not limited thereto.

BRIEF DESCRIPTION OF THE DRAWINGS

The accompanying drawings herein are incorporated in and constitute a part of the present specification, illustrate embodiments conforming to the present disclosure and, together with the description, serve to explain the principles of the present disclosure. It is apparent that the accompanying drawings in the description below are merely some embodiments of the present disclosure, and those skilled in the art can obtain other accompanying drawings from these accompanying drawings without creative work.

DETAILED DESCRIPTION

Example implementations will now be described more fully with reference to the accompanying drawings. However, the example implementations can be implemented in a variety of forms and should not be construed as being limited to the examples set forth herein. In contrary, these implementations are provided so that the present disclosure will be more comprehensive and complete, and will fully convey the conceptions of the exemplary implementations to those skilled in the art. The same reference numerals in the figures indicate the same or similar structures, and thus the detailed descriptions thereof will be omitted.

Although relative terms, such as "above" and "below", are used in the present specification to describe the relative relationship between one component and another component of an icon, these terms are used in the present specification merely for convenience, for example, according to the directions of the examples described in the drawings. It will be appreciated that if a module of the icon is flipped upside down, a component described as being "above" another component will become a component described as being "below" another component. Other relative terms such as "high", "low", "top", "bottom", "left" and "right" also have similar meanings. When a structure is located "above" other structures, it may indicate that the structure is integrally formed on other structures, or the structure is "directly" disposed on other structures, or the structure is "indirectly" disposed on other structures through another structure.

The terms "one", "a/an" and "the" are used to indicate the presence of one or more elements/components/etc. The terms "include" and "have" are used to indicate an open-type inclusion and mean that there may be additional elements/components or the like in addition to the listed elements/components or the like.

In the related art, a breakdown voltage vt1 of a MOS device for CDM electrostatic protection is greater than a breakdown voltage of an oxide layer of a MOS device of an input buffer. When ESD occurs, the oxide layer of the MOS device of the input buffer breaks down prior to the MOS device for CDM electrostatic protection, and an original ESD design window does not exist, so that a good CDM electrostatic protection effect cannot be achieved.

To solve the above problems, the embodiment of the present disclosure provides an electrostatic protection circuit to achieve CDM electrostatic protection.

Figure 1:
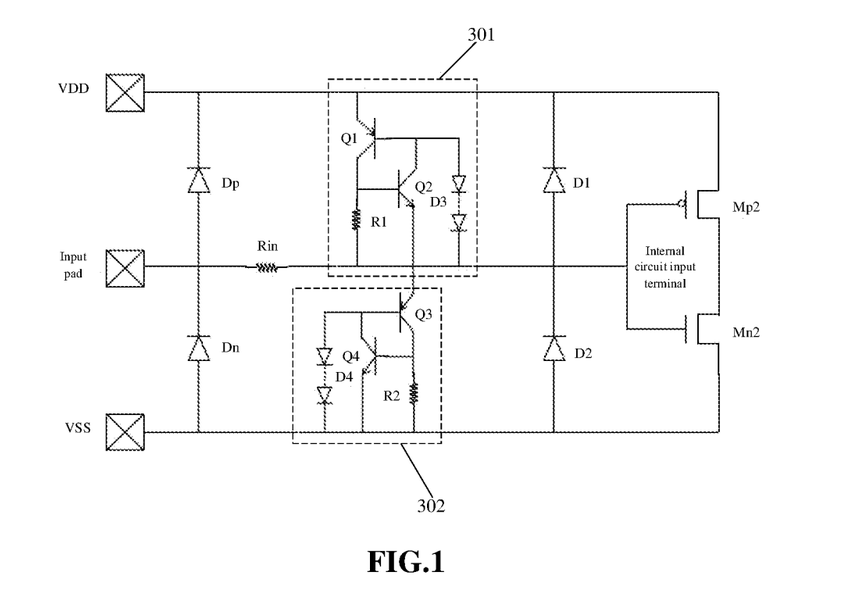
FIG. 1 schematically illustrates a structural view of an electrostatic protection circuit in an embodiment of the present disclosure.

As shown in FIG. 1, the embodiment of the present disclosure provides an electrostatic protection circuit, which is connected with an internal circuit and includes a first circuit 301, a first diode D1 connected in parallel with the first circuit 301, a second circuit 302, and a second diode D2 connected in parallel with the second circuit 302. The first circuit is connected between a power supply pad and an internal circuit input terminal. The second circuit is connected between the internal circuit input terminal and a ground pad. The first circuit 301 and the second circuit 302 may be DTSCR circuits.

In the technical solution of the embodiment of the present disclosure, DTSCRs and diodes are respectively adopted between the internal circuit input terminal and VSS and between the internal circuit input terminal and VDD, namely between the input buffer and VSS and between the input buffer and VDD, so that the problem of CDM electrostatic protection of an advanced manufacturing process when a breakdown voltage of an oxide layer of a MOS is less than that of a junction can be solved, and therefore an original ESD design window can be recovered.

In the embodiment of the present disclosure, the input buffer includes a first MOS device Mp2 and a second MOS device Mn2. Sources and drains of the first MOS device Mp2 and the second MOS device Mn2 are connected in series and then connected between the power supply pad VDD and the ground pad VSS. A gate of the first MOS device Mp2 and a gate of the second MOS device Mn2 are connected at an internal circuit input terminal Inside and then are connected with an input pad Input. The first MOS device Mp2 may be a positive channel metal oxide semiconductor (PMOS) and the second MOS device Mn2 may be a negative channel metal oxide semiconductor (NMOS).

Specifically, when the circuit operates normally, the normal operation of the input circuit is not affected. When ESD occurs, since a conduction voltage of the second circuit 302 for CDM protection is less than a breakdown voltage of an oxide layer of the second MOS device Mn2 of the input buffer, the second circuit 302 for CDM protection is conductive firstly and discharges electrostatic current, thereby achieving CDM electrostatic protection. The second diode D2 can provide an electrostatic discharge path in another direction.

Similarly, when electrostatic protection is performed by the first circuit 301 and the first diode D1, since a conduction voltage of the first circuit 301 for CDM protection is less than a breakdown voltage of an oxide layer of the first MOS device Mp2 of the input buffer, the first circuit 301 for CDM protection is conductive on and discharges electrostatic current, thereby achieving CDM electrostatic protection. The first diode D1 can provide an electrostatic discharge path in another direction.

The first circuit 301 includes a first PNP transistor Q1 and a first NPN transistor Q2. An emitter of the first PNP transistor Q1 is connected with the power supply pad. A base of the first PNP transistor Q1 is connected with a collector of the first NPN transistor Q2 and then connected with the internal circuit input terminal Inside through at least two third diodes D3 connected in series. A collector of the first PNP transistor Q1 is connected with a base of the first NPN transistor Q2 and then connected with the internal circuit input terminal Inside through a first resistor R1. An emitter of the first NPN transistor Q2 is connected with the internal circuit input terminal Inside. A negative electrode of the first diode D1 is connected with the power supply pad VDD.

The second circuit 302 includes a second PNP transistor Q3 and a second NPN transistor Q4. An emitter of the second PNP transistor Q3 is connected with the internal circuit input terminal Inside. A base of the second PNP transistor Q3 is connected with a collector of the second NPN transistor Q4 and then connected with the ground pad VSS through at least two fourth diodes D4 connected in series. A collector of the second PNP transistor Q3 is connected with a base of the second NPN transistor Q4 and then connected with the ground pad VSS through a second resistor R2. A positive electrode of the second diode D2 is connected with the ground pad VSS.

A silicon controlled rectifier is equivalent to a combination of a PNP transistor and an NPN transistor. An electrostatic pulse introduced by the internal circuit input terminal Inside enables the two transistors of the silicon controlled rectifier to be saturated and conductive in a very short time. The second circuit 302 is taken as an example, the electrostatic pulse of the internal circuit generates a voltage drop on the second resistor R2 to conduct the NPN transistor Q4 and further conduct the PNP transistor Q3 to trigger the silicon controlled rectifier to be conductive. After the transistors achieve trigger conduction, the electrostatic pulse may be released from the second NPN transistor Q4 and the second PNP transistor Q3.

Here, the number of the at least two third diodes D3 and the at least two fourth diodes D4 is selected according to an input voltage of the input pad Input and the breakdown voltages of the oxide layers of the first MOS device Mp2 and the second MOS device Mn2. In at least one of the embodiment, the first circuit 301 may include one third diode D3 and the second circuit 302 may also include one fourth diode D4.

In the embodiment of the present disclosure, conduction voltages of the first circuit 301 and the second circuit 302 need to be less than the breakdown voltage of the oxide layer of the input buffer. By adjusting the number of diodes connected in series, the conduction voltages of the first circuit 301 and the second circuit 302 may be controlled such that the conduction voltages are greater than a normal operating voltage of the input pad Input and less than the breakdown voltage of the oxide layer of the second MOS device Mn2.

Specifically, the conduction voltage of the second circuit 302 is greater than the normal operating voltage of the input pad Input, and less than the breakdown voltage of the oxide layer of the second MOS device Mn2. The conduction voltage of the first circuit 301 is greater than a voltage difference between a power supply voltage VDD and the normal operating voltage of the input pad Input, and less than the breakdown voltage of the oxide layer of the first MOS device Mp2.

In this way, during the normal operation, when the first circuit 301 or the second circuit 302 connected with the internal circuit input terminal Inside, the power supply pad, and the ground pad are in a non-conduction state, the normal operation of the input circuit can be ensured during the normal operation.

In summary, the first circuit 301 and the second circuit 302 provided by the embodiment of the present disclosure can ensure the normal operation of the input circuit during the normal operation, and a bidirectional discharge path of CDM electrostatic protection is provided, thereby playing the role of CDM electrostatic protection.

In the embodiment of the present disclosure, the electrostatic protection circuit further includes an input resistor Rin connected between the input pad Input and the internal circuit input terminal Inside. The input pad Input is connected with the internal circuit input terminal Inside through the input resistor Rin.

The electrostatic protection circuit further includes a fifth diode Dp and a sixth diode Dn. The fifth diode Dp is connected between the power supply pad VDD and the input pad Input, and the sixth diode Dn is connected between the input pad Input and the ground pad VSS. A positive electrode of the fifth diode Dp is connected with the input pad Input. A positive electrode of the sixth diode Dn is connected with the ground pad VSS.

The fifth diode Dp and the sixth diode Dn may provide an electrostatic discharge path for human body model ESD.

Figure 2:
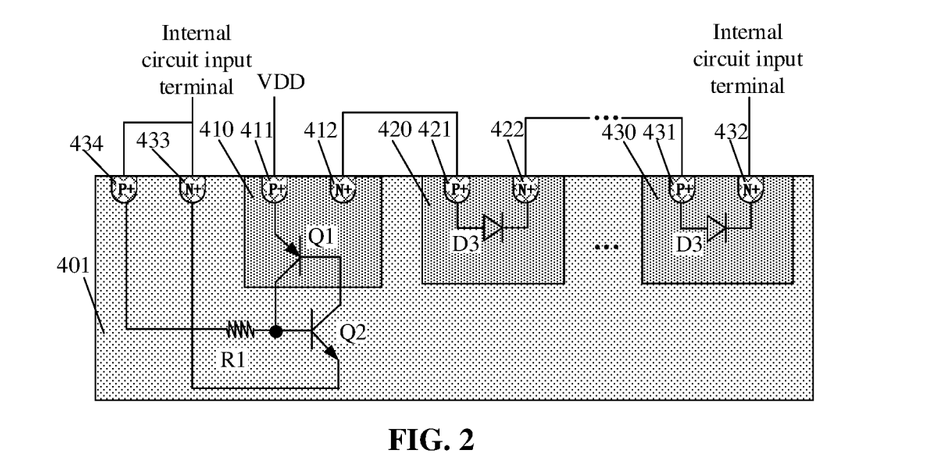
FIG. 2 schematically illustrates a cross-sectional view of a first circuit in an embodiment of the present disclosure.
Figure 3:
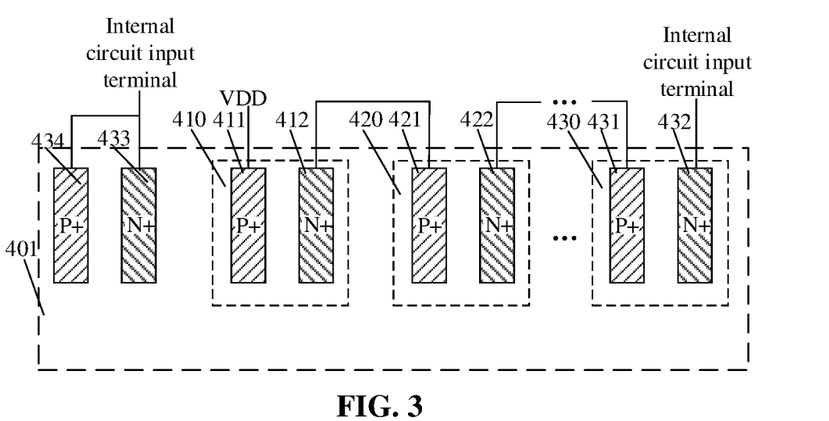
FIG. 3 schematically illustrates a top view of a first circuit in an embodiment of the present disclosure.

As shown in FIGS. 2 and 3, the ground pad and the power supply pad are both located on a bare chip. A first well 410, a second well 420 and a third well 430 are disposed in a substrate 401 of the bare chip. The substrate 401 is a positive-type (P-type) substrate. The first well 410, the second well 420 and the third well 430 are all negative (N) wells. The first well 410 includes a first P-type heavily doped region 411 and a first N-type heavily doped region 412, and the power supply pad VDD is electrically connected with the first P-type heavily doped region 411. The second well 420 includes a second P-type heavily doped region 421 and a second N-type heavily doped region 422, and the second P-type heavily doped region 421 is electrically connected with the first N-type heavily doped region 412. The third well 430 includes a third P-type heavily doped region 431 and a third N-type heavily doped region 432, the third P-type heavily doped region 431 is electrically connected with the second N-type heavily doped region 422, and the internal circuit input terminal Inside is electrically connected with the third N-type heavily doped region 432. A seventh N-type heavily doped region 433 and a seventh P-type heavily doped region 434 are further included in the substrate 401, and the internal circuit input terminal Inside is electrically connected with the seventh N-type heavily doped region 433 and the seventh P-type heavily doped region 434.

The first P-type heavily doped region 411, the first well 410 and the substrate 401 form the first PNP transistor. The first well 410, the substrate 401 and the seventh N-type heavily doped region 433 form the first NPN transistor. The first resistor R1 is formed between the first well 410 and the seventh P-type heavily doped region 434.

As shown in FIG. 2, the third diode D3 is formed between the second P-type heavily doped region 421 and the second N-type heavily doped region 422 in the second well 420. The third diode D3 is formed between the third P-type heavily doped region 431 and the third N-type heavily doped region 432 in the third well 430.

Multiple N wells may also be disposed between the second well 420 and the third well 430. These N wells have the same structure as the second well 420 and the third well 430. One third diode D3 is formed in each N well, which is equivalent to connecting multiple third diodes D3 in series between the base of the first PNP transistor Q1 and the internal circuit input terminal Inside.

A negative-to-VDD electrostatic discharge mode (ND-mode) from the internal circuit input terminal Inside to the power supply pad VDD is shown in FIG. 2. In this mode, the first PNP transistor Q1 and the first NPN transistor Q2 are conductive at the same time. An electrostatic pulse of a positive electrode of a power supply is released to the internal circuit input terminal Inside via the conductive first PNP transistor Q1 and the first NPN transistor Q2.

In the embodiment of the present disclosure, the first diode D1 is formed between the third well 430 and the first well 410. In a positive-to-VDD electrostatic discharge mode (PD-mode) from the internal circuit input terminal Inside to the power supply pad VDD, the first PNP transistor Q1 and the first NPN transistor Q2 are not conductive, and an electrostatic pulse of the internal circuit is released to the positive electrode of the power supply via the first diode D1.

Figure 4:
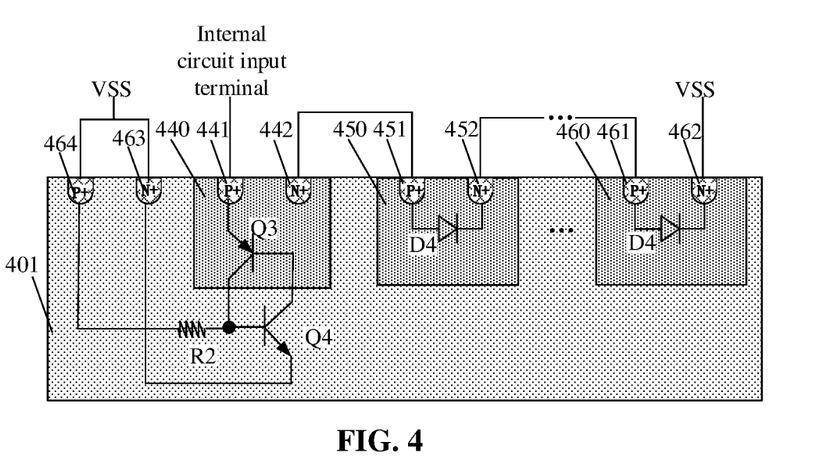
FIG. 4 schematically illustrates a cross-sectional view of a second circuit in an embodiment of the present disclosure.
Figure 5:
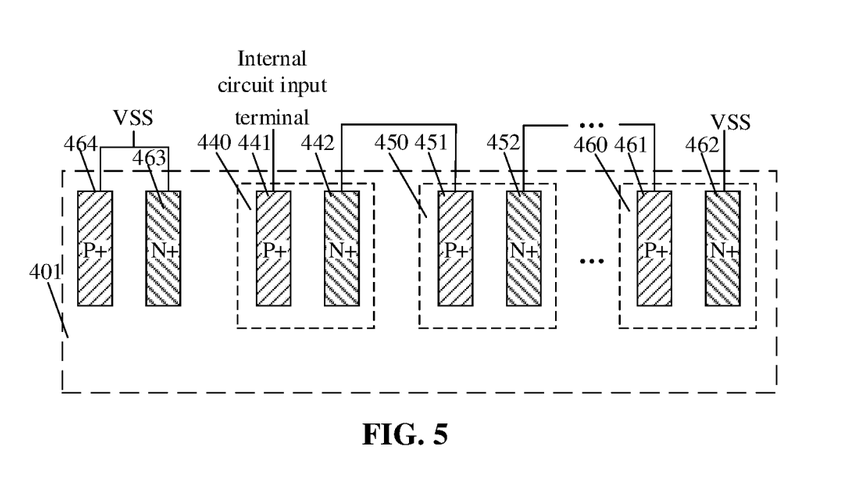
FIG. 5 schematically illustrates a top view of a second circuit in an embodiment of the present disclosure.

As shown in FIGS. 4 and 5, a fourth well 440, a fifth well 450 and a sixth well 460 are disposed in the substrate. The fourth well 440, the fifth well 450 and the sixth well 460 are all N wells. The fourth well 440 includes a fourth P-type heavily doped region 441 and a fourth N-type heavily doped region 442, and the internal circuit input terminal Inside is electrically connected with the fourth P-type heavily doped region 441. The fifth well 450 includes a fifth P-type heavily doped region 451 and a fifth N-type heavily doped region 452, and the fifth P-type heavily doped region 451 is electrically connected with the fourth N-type heavily doped region 442. The sixth well 460 includes a sixth P-type heavily doped region 461 and a sixth N-type heavily doped region 462, the sixth P-type heavily doped region 461 is electrically connected with the fifth N-type heavily doped region 452, and the ground pad VSS is electrically connected with the sixth N-type heavily doped region 462. An eighth N-type heavily doped region 463 and an eighth P-type heavily doped region 464 are further included in the substrate 401. The eighth N-type heavily doped region 463 and the eighth P-type heavily doped region 464 are both electrically connected with the ground pad.

The fourth P-type heavily doped region 441, the fourth well 440 and the substrate 401 form the second PNP transistor. The fourth well 440, the substrate 401 and the eighth N-type heavily doped region 463 form the second NPN transistor. The second resistor R2 is formed between the fourth well 440 and the eighth P-type heavily doped region 464.

As shown in FIG. 4, the fourth diode D4 is formed between the fifth P-type heavily doped region 451 and the fifth N-type heavily doped region 452 in the fifth well 450. The fourth diode D4 is formed between the sixth P-type heavily doped region 461 and the sixth N-type heavily doped region 462 in the sixth well 460.

Multiple N wells may also be disposed between the fifth well 450 and the sixth well 460. These N wells have the same structure as the fifth well 450 and the sixth well 460. One fourth diode D4 is formed in each N well, which is equivalent to connecting multiple fourth diodes D4 in series between the base of the sixth PNP transistor Q3 and the ground pad VSS.

A negative-to-VSS electrostatic discharge mode (NS-mode) from the internal circuit input terminal Inside to the ground pad VSS is shown in FIG. 4. In this mode, the second PNP transistor Q3 and the second NPN transistor Q4 are conductive at the same time. The electrostatic pulse of the internal circuit is released to a power supply ground via the conductive second PNP transistor Q3 and the second NPN transistor Q4.

In the embodiment of the present disclosure, the second diode is formed between the sixth well and the fourth well. In a positive-to-VSS discharge mode (PS-mode) from the internal circuit input terminal Inside to the ground pad VSS, the second PNP transistor Q3 and the second NPN transistor Q4 are not conductive, and the electrostatic pulse introduced by the power supply ground is released to the internal circuit input terminal Inside via the second diode D2.

When ESD occurs, the internal circuit may discharge static electricity through the electrostatic protection circuit. The internal circuit may be in four modes during ESD, which includes negatively charging from the internal circuit input terminal Inside to the power supply pad VDD, where a discharge path is the first PNP transistor Q1 and the first NPN transistor Q2; positively charging from the internal circuit input terminal Inside to the power supply pad VDD, where a discharge path is the first diode D1; negatively charging from the internal circuit input terminal Inside to the ground pad VSS, where a discharge path is the second PNP transistor Q3 and the second NPN transistor Q4; and negatively charging from the internal circuit input terminal Inside to the ground pad VSS, where a discharge path is the second diode D2. According to the technical solution of the embodiment of the present disclosure, the electrostatic protection for the four modes under a CDN can be realized.

The circuit design of the embodiment of the present disclosure may be applied to ESD protection of input and output circuits of a semiconductor integrated circuit, and particularly may be applied to CDM electrostatic protection of input circuits of advanced processes in which an oxide layer of the semiconductor integrated circuit is relatively thin. The circuit design method may also be applied to ESD protection of various semiconductor integrated circuits such as logic, analog and CDMs of various memory chips.

In the electrostatic protection circuit provided by the embodiment of the present disclosure, the DTSCR circuits and the diodes are disposed between the internal circuit and the power supply pad and between the internal circuit and the ground pad, so that electrostatic protection on the CDM is achieved. Since the MOS device is not adopted for electrostatic protection, when the MOS device of the electrostatic protection circuit is subjected to CDM ESD, the oxide layer of the MOS device of the input buffer is prevented from breaking down prior to the MOS device of the electrostatic protection circuit, so that the electrostatic protection capability of the chip is improved.

Other embodiments of the present disclosure will be apparent to those skilled in the art from consideration of the specification and practice of the present disclosure disclosed herein. This application is intended to cover any variations, uses or adaptations of the present disclosure following the general principles thereof and including common knowledge or conventional techniques in the art that are not disclosed in the present disclosure. The specification and embodiments are regarded as being exemplary only, and the true scope and spirit of the present disclosure is indicated by the following claims.

It will be appreciated that the present disclosure is not limited to the exact structures that has been described above and illustrated in the accompanying drawings, and various modifications and changes may be made without departing from the scope thereof. The scope of the present disclosure is limited only by the appended claims.

The invention claimed is:

1. An electrostatic protection circuit, connected with an internal circuit and comprising:
   a first circuit, a first diode connected in parallel with the first circuit, a second circuit, and a second diode connected in parallel with the second circuit, wherein
   the first circuit is connected between a power supply pad and an internal circuit input terminal, and the second circuit is connected between the internal circuit input terminal and a ground pad;
   the first circuit comprises at least two third diodes, the second circuit comprises at least two fourth diodes, and the number of the third diodes and the number of the fourth diodes are adjusted such that conduction voltages of the first circuit and the second circuit are greater than an operating voltage of an input pad and less than a breakdown voltage of an electronic device connected to the internal circuit input terminal; and
   the first circuit and the second circuit are diode-triggered silicon controlled rectifier (DTSCR) circuits.

2. The electrostatic protection circuit of claim 1, wherein the first circuit comprises a first positive-negative-positive (PNP) transistor and a first negative-positive-negative (NPN) transistor, an emitter of the first PNP transistor is connected with the power supply pad, a base of the first PNP transistor is connected with a collector of the first NPN transistor and then connected with the internal circuit input terminal through the at least two third diodes connected in series, a collector of the first PNP transistor is connected with a base of the first NPN transistor and then connected with the internal circuit input terminal through a first resistor, an emitter of the first NPN transistor is connected with the internal circuit input terminal, and a negative electrode of the first diode is connected with the power supply pad; and
   the second circuit comprises a second PNP transistor and a second NPN transistor, an emitter of the second PNP transistor is connected with the internal circuit input terminal, a base of the second PNP transistor is connected with a collector of the second NPN transistor and then connected with the ground pad through the at least two fourth diodes connected in series, a collector of the second PNP transistor is connected with a base of the second NPN transistor and then connected with the ground pad through a second resistor, and a positive electrode of the second diode is connected with the ground pad.

3. The electrostatic protection circuit of claim 2, further comprising: a fifth diode connected between the power supply pad and the input pad, and a sixth diode connected between the input pad and the ground pad,
   wherein a positive electrode of the fifth diode is connected with the input pad, and a positive electrode of the sixth diode is connected with the ground pad.

4. The electrostatic protection circuit of claim 3, further comprising: an input resistor connected between the input pad and the internal circuit input terminal.

5. The electrostatic protection circuit of claim 4, wherein the ground pad and the power supply pad are both located on a bare chip, a first well, a second well and a third well are disposed in a substrate of the bare chip, the substrate is a positive-type (P-type) substrate, and the first well, the second well and the third well are all negative (N) wells;
   the first well comprises a first P-type heavily doped region and a first N-type heavily doped region, and the power supply pad is electrically connected with the first P-type heavily doped region;
   the second well comprises a second P-type heavily doped region and a second N-type heavily doped region, and the second P-type heavily doped region is electrically connected with the first N-type heavily doped region; and
   the third well comprises a third P-type heavily doped region and a third N-type heavily doped region, the third P-type heavily doped region is electrically connected with the second N-type heavily doped region, and the internal circuit input terminal is electrically connected with the third N-type heavily doped region.

6. The electrostatic protection circuit of claim 5, wherein the substrate further includes a seventh N-type heavily doped region and a seventh P-type heavily doped region, both of which are electrically connected with the internal circuit input terminal.

7. The electrostatic protection circuit of claim 6, wherein the first P-type heavily doped region, the first well and the substrate form the first PNP transistor; and
   the first well, the substrate and the seventh N-type heavily doped region form the first NPN transistor.

8. The electrostatic protection circuit of claim 6, wherein the first resistor is formed between the first well and the seventh P-type heavily doped region.

9. The electrostatic protection circuit of claim 5, wherein the first diode is formed between the third well and the first well.

10. The electrostatic protection circuit of claim 5, wherein a fourth well, a fifth well and a sixth well are disposed in the substrate, and the fourth well, the fifth well and the sixth well are all N wells;
    the fourth well comprises a fourth P-type heavily doped region and a fourth N-type heavily doped region, and the internal circuit input terminal is electrically connected with the fourth P-type heavily doped region;
    the fifth well comprises a fifth P-type heavily doped region and a fifth N-type heavily doped region, and the fifth P-type heavily doped region is electrically connected with the fourth N-type heavily doped region; and
    the sixth well comprises a sixth P-type heavily doped region and a sixth N-type heavily doped region, the sixth P-type heavily doped region is electrically connected with the fifth N-type heavily doped region, and the ground pad is electrically connected with the sixth N-type heavily doped region.

11. The electrostatic protection circuit of claim 10, wherein the substrate further includes an eighth N-type heavily doped region and an eighth P-type heavily doped region, both of which are electrically connected with the ground pad.

12. The electrostatic protection circuit of claim 11, wherein the fourth P-type heavily doped region, the fourth well and the substrate form the second PNP transistor; and the fourth well, the substrate and the eighth N-type heavily doped region form the second NPN transistor.

13. The electrostatic protection circuit of claim 11, wherein the second resistor is formed between the fourth well and the eighth P-type heavily doped region.

14. The electrostatic protection circuit of claim 10, wherein the second diode is formed between the sixth well and the fourth well.

15. The electrostatic protection circuit of claim 10, wherein multiple N wells are disposed between the fifth well and the sixth well, and one of the at least two fourth diodes is formed in each N well.

16. The electrostatic protection circuit of claim 5, wherein multiple N wells are disposed between the second well and the third well, and one of the at least two third diodes is formed in each N well.

* * * * *